US009897667B2

(12) United States Patent
Holm et al.

(10) Patent No.: US 9,897,667 B2
(45) Date of Patent: Feb. 20, 2018

(54) MAGNETIC FIELD SENSOR WITH PERMANENT MAGNET BIASING

(71) Applicant: Freescale Semiconductor, Inc., Austin, TX (US)

(72) Inventors: Paige M. Holm, Phoenix, AZ (US); Lianjun Liu, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/006,746

(22) Filed: Jan. 26, 2016

(65) Prior Publication Data
US 2017/0212189 A1 Jul. 27, 2017

(51) Int. Cl.
G01R 33/09 (2006.01)
G01R 33/00 (2006.01)
G01R 17/10 (2006.01)

(52) U.S. Cl.
CPC ............ G01R 33/098 (2013.01); G01R 17/10 (2013.01); G01R 33/0005 (2013.01); G01R 33/093 (2013.01)

(58) Field of Classification Search
CPC .................................................. G01R 33/0206
See application file for complete search history.

(56) References Cited

U.S. PATENT DOCUMENTS

| 5,592,082 A | 1/1997 | Kuriyama |
| 5,737,155 A | 4/1998 | George et al. |
| 6,501,678 B1 * | 12/2002 | Lenssen ................ B82Y 25/00 257/E27.005 |
| 7,589,528 B2 | 9/2009 | Sato et al. |
| 7,965,077 B2 | 6/2011 | Engel et al. |

(Continued)

FOREIGN PATENT DOCUMENTS

| EP | 2 860 542 A1 | 4/2015 |
| EP | 2 860 543 A1 | 4/2015 |

(Continued)

OTHER PUBLICATIONS

Non Final Office Action; U.S. Appl. No. 15/079,764; 38 pages (Oct. 11, 2017).

(Continued)

Primary Examiner — Clayton E Laballe
Assistant Examiner — Noam Reisner
(74) Attorney, Agent, or Firm — Charlene R. Jacobsen

(57) ABSTRACT

A magnetic field sensor comprises a sensor bridge having multiple sensor legs. Each sensor leg includes magnetoresistive sense elements located in a plane of the magnetic field sensor. Each sense element comprises a pinned layer and a sense layer. The pinned layer has a reference magnetization oriented parallel to the plane and the sense layer has a sense magnetization oriented out-of-plane. A permanent magnet layer may be spaced apart from the sense elements which magnetically biases the sense magnetization of the sense layer into an out-of-plane direction that is non-perpendicular to the plane of the sensor. The sense magnetization is orientable from the out-of-plane direction toward the plane of the sensor in response to an external magnetic field. The permanent magnet layer enables detection of the external magnetic field in a sensing direction that is also perpendicular to the plane of the magnetic field sensor.

12 Claims, 5 Drawing Sheets

(56) References Cited

U.S. PATENT DOCUMENTS

| | | |
|---|---|---|
| 8,816,683 B2 | 8/2014 | Wang et al. |
| 2004/0023064 A1 | 2/2004 | Ehresmann et al. |
| 2004/0137275 A1 | 7/2004 | Jander et al. |
| 2009/0027048 A1 | 1/2009 | Sato et al. |
| 2009/0237074 A1 | 9/2009 | Kou et al. |
| 2010/0118447 A1 | 5/2010 | Hammerschmidt et al. |
| 2010/0231214 A1* | 9/2010 | Zhou ............... G01N 24/088 324/252 |
| 2010/0276389 A1 | 11/2010 | Mather et al. |
| 2011/0074406 A1 | 3/2011 | Mather et al. |
| 2011/0134572 A1 | 6/2011 | Qiu et al. |
| 2011/0244599 A1 | 10/2011 | Whig et al. |
| 2012/0212217 A1 | 8/2012 | Engel et al. |
| 2012/0281319 A1 | 11/2012 | Singleton et al. |
| 2013/0277781 A1 | 10/2013 | Deak et al. |
| 2013/0300402 A1* | 11/2013 | Liu ............... G01R 33/09 324/202 |
| 2013/0328556 A1 | 12/2013 | Granig et al. |
| 2014/0021571 A1 | 1/2014 | Lei et al. |
| 2014/0035570 A1 | 2/2014 | Jin et al. |
| 2014/0035573 A1 | 2/2014 | Deak et al. |
| 2014/0225605 A1* | 8/2014 | Lei ............... G01R 33/093 324/252 |
| 2014/0247042 A1 | 9/2014 | Lei et al. |
| 2014/0292318 A1 | 10/2014 | Wang et al. |
| 2014/0327437 A1 | 11/2014 | Han et al. |
| 2015/0091560 A1 | 4/2015 | Deak et al. |
| 2015/0125966 A1 | 5/2015 | Liu et al. |
| 2015/0137292 A1 | 5/2015 | Khalili Amiri et al. |
| 2015/0145504 A1 | 5/2015 | Bai et al. |
| 2015/0191560 A1 | 7/2015 | Andrews et al. |
| 2015/0309125 A1 | 10/2015 | Huang et al. |
| 2015/0346290 A1 | 12/2015 | Holm et al. |
| 2015/0364677 A1 | 12/2015 | Deak et al. |
| 2016/0056371 A1 | 2/2016 | Lei et al. |
| 2017/0123016 A1 | 5/2017 | Deak |
| 2017/0212175 A1 | 7/2017 | Holm et al. |
| 2017/0212176 A1 | 7/2017 | Holm et al. |
| 2017/0276738 A1 | 9/2017 | Holm et al. |

FOREIGN PATENT DOCUMENTS

| | | |
|---|---|---|
| EP | 3 229 035 A1 | 10/2017 |
| WO | 2008/020817 A1 | 2/2008 |
| WO | 2015/158243 A1 | 10/2015 |

OTHER PUBLICATIONS

Notice of Allowance; U.S. Appl. No. 15/006,952; May 10, 2017.
Notice of Allowance; U.S. Appl. No. 15/134,573; 21 pages (Oct. 16, 2017).
Notice of Allowance; U.S. Appl. No. 15/134,573 (Aug. 1, 2017).
U.S. Appl. No. 15/134,573, not yet published; (Apr. 21, 2016).
Notice of Allowance; U.S. Appl. No. 15/006,911; 14 pages (Oct. 6, 2017).
Restriction/Election; U.S. Appl. No. 15/079,764; 8 pages (Aug. 4, 2017).
U.S. Appl. No. 15/093,224; Not Yet Published; Filed Apr. 7, 2016.
Non Final Office Action; U.S. Appl. No. 15/079,764 (Oct. 11, 2017).
Notice of Allowance; U.S. Appl. No. 15/006,911; 13 pages (Oct. 30, 2017).

\* cited by examiner

PRIOR ART

MAGNETIC FIELD SENSOR WITH PERMANENT MAGNET BIASING

TECHNICAL FIELD OF THE INVENTION

The present invention relates generally to magnetoelectronic devices. More specifically, the present invention relates to a magnetic field sensor with multiple axis sensing and permanent magnet biasing.

BACKGROUND OF THE INVENTION

Magnetic field sensors, also known as magnetometers, are widely used in a number of applications including in, for example, compass, security, and military applications, geophysics and space research, biomagnetism and medical applications, and non-destructive testing. Magnetic field sensors are typically based on semiconductor materials (e.g., Hall sensors, magnetoresistors, and so forth) and ferromagnetic materials (e.g., ferromagnetic magnetoresistors and flux guides). Other magnetic field sensors utilize optical, resonant, and superconducting properties.

In many Earth's field magnetic sensing applications, especially those involving compassing or orientation, it is extremely desirable to have three-axis sensing capability. In order to achieve low cost of such sensors, it is also desirable that the solution be a single chip or even fully integrable onto the accompanying application specific integrated circuit (ASIC) die. In handheld and miniaturized applications it is also critical to minimize power consumption in order to extend battery life.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, embodiments disclosed herein entail a magnetic field sensor capable of sensing magnetic fields along one or more mutually exclusive sense axes, typically referred to as the X-axis, Y-axis, and Z-axis. More particularly, sensor bridge designs of magnetoresistive sense elements are implemented for each sense axis. Each sensor bridge incorporates multiple orientations of reference magnetization of the pinned layer, along with out-of-plane biasing of the sense layer for each of the magnetoresistive sense elements. Additionally, one sensor bridge design is utilized for sensing an external magnetic field that is perpendicular to the plane of the magnetic field sensor package and includes a single permanent magnetic layer with a single magnetization direction to enable sensing of the out-of-plane external magnetic field without the use of flux concentrators. The various inventive concepts and principles embodied herein enable an ultra low power, multiple sense axis magnetic field sensor without detrimental perming effects for improved sensitivity, reliability, and cost savings.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like may be used herein solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
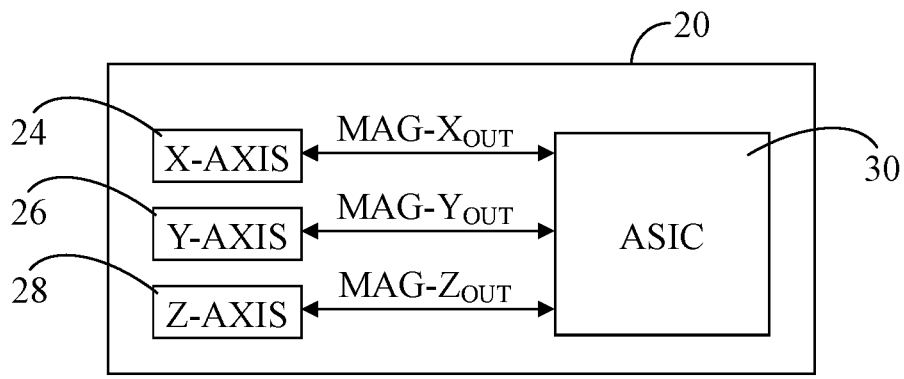
FIG. 1 shows a simplified block diagram of a magnetic field sensor package.

Referring to FIG. 1, FIG. 1 shows a simplified block diagram of a magnetic field sensor package 20. Magnetic field sensor package 20 may be implemented in any device or system in which magnetic field sensing is required, for example, in compass, security, and military applications, in geophysics and space research applications, in biomagnetism and medical applications, and/or in non-destructive testing. In this example, sensor package 20 may be adapted to sense a magnetic field along three axes. Hence, sensor package 20 includes an X-axis magnetic field sensor 24, a Y-axis magnetic field sensor 26, and a Z-axis magnetic field sensor 28. Magnetic field sensors 24, 26, 28 may be coupled to, or otherwise in communication with, an application specific integrated circuit (ASIC) 30 to form sensor package 20. ASIC 30 performs some or all functions including, but not limited to, signal conditioning and data management, reset and stabilization control, bridge/output multiplexing, self-test, electrostatic discharge (ESD) protection, and so forth.

In an exemplary configuration, magnetic field sensors 24, 26, 28 may be magnetic tunnel junction (MTJ) sensors. An MTJ structure includes a metal-insulator-metal layer sandwich in which the metal layers are ferromagnetic and the insulator layer is very thin. Electrically, this forms a tunnel diode in which electrons can tunnel from one ferromagnet into the other. Such a tunnel diode exhibits transport characteristics that depend, not only on the voltage bias, but also on the magnetic states of the top and bottom electrodes.

Figure 2:
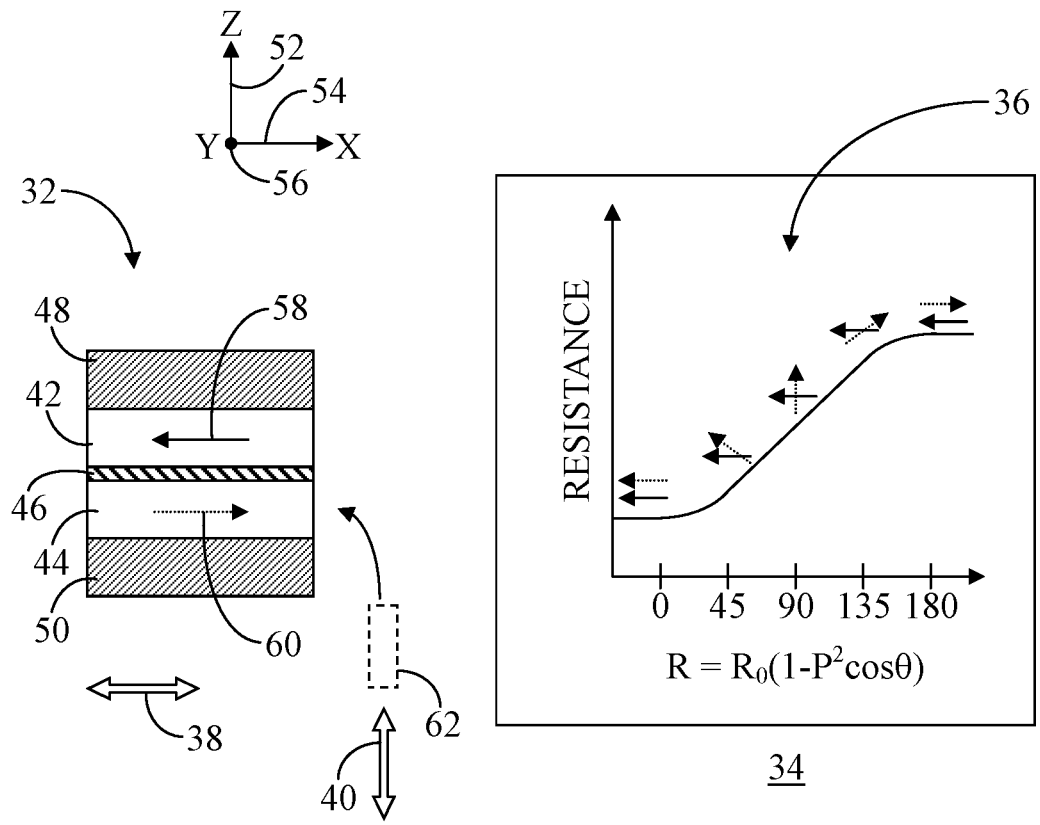
FIG. 2 shows a simplified side view of an exemplary magnetoresistive sense element with an accompanying plot of resistances that may occur in the presence of an external magnetic field.

FIG. 2 shows a simplified side view of an exemplary magnetoresistive sense element 32 with an accompanying plot 34 of a variable resistance 36 in the presence of an external magnetic field, represented by arrows 38, 40. More particularly, exemplary magnetoresistive sense element 32 is an exemplary MTJ structure that includes ferromagnetic layers 42, 44 separated by an insulator layer 46. An electrode 48 may be in electrical communication with ferromagnetic layer 42 and another electrode 50 may be in electrical communication with ferromagnetic layer 44. This structure may be formed within a dielectric material, not shown herein for simplicity.

In the side view illustration of FIG. 2, a Z-axis 52 is oriented up-and-down on the page, an X-axis 54 is oriented right-and-left on the page, and a Y-axis 56 is represented as a dot that depicts an axis going either into or out of the page on which FIG. 2 is situated. Thus, the X-Y plane in this side view illustration is oriented right-and-left and into or out of the page. Accordingly, external magnetic field 38 represents a magnetic field that is parallel to the X-Y plane of magnetoresistive sense element 32. More particularly, external magnetic field 38 is generally parallel to X-axis 54. Conversely, external magnetic field 40 represents a magnetic field that is perpendicular to the X-Y plane of magnetoresistive sense element 32. That is, external magnetic field is generally parallel to Z-axis 52.

Ferromagnetic layer 42 may be fixed, or "pinned," to have a reference magnetization, as represented by a solid arrow 58. Therefore, ferromagnetic layer 42 is referred to hereinafter as pinned layer 42. Ferromagnetic layer 44 is "free" to respond to, i.e., sense, the applied magnetic field (e.g., external magnetic field 38, 40) to provide a sense magnetization, represented by a dotted arrow 60. Sense magnetization 60 modulates the measured resistance 36. Accordingly, ferromagnetic layer 44 is referred to hereinafter as sense layer 44.

At a fixed voltage bias, resistance 36 depends upon the states of electrodes 48, 50. Since electrodes 48, 50 are electrically coupled with pinned and sense layers 42, 44, respectively, the states of electrodes 48, 50 depend upon the alignment of the magnetic moments of the pinned and sense layers 42, 44. By way of example and referring to plot 34, in the presence of X-axis external magnetic field 38, when the magnetic moments of pinned and sense layers 42, 44 are parallel (i.e., the vectors lie along parallel lines and point in the same direction) resistance 36 of the junction is lowest. However, resistance 36 of the junction is highest when the magnetic moments are anti-parallel (i.e., the vectors lie along parallel lines but point in the opposite direction). And in between, resistance 36 of the junction varies as the cosine of the angle between magnetic moments. One or more MTJ resistors, such as magnetoresistive sense element 32, may be utilized to form either of X-axis or Y-axis magnetic field sensors 24, 26 (FIG. 1) for sensing an external magnetic field that is parallel to the X-Y plane of magnetoresistive sense element 32.

In order to sense Z-axis magnetic field 40 in a direction perpendicular to the X-Y plane of magnetoresistive sense element 32, one or more flux guides 62 (one shown in dashed line form) are also formed within the dielectric material (not shown) in which magnetoresistive sense element 32 is formed. Per convention, flux guides 62 can be used to guide Z-axis magnetic field 40 into the X-Y plane. Flux guides 62 are generally thin, narrow sheets of magnetic material typically used to guide flux, i.e., Z-axis magnetic field 40, to a preferred location. With the use of flux guides 62 incorporated into, for example, Z-axis magnetic field sensor 28 (FIG. 1), Z-axis magnetic field 40 is suitably guided so that it can be sensed using one or more in-plane magnetoresistive sense elements 32.

For optimal Z axis response, flux guides 62 have a preferred magnetization orientation. That is, the magnetic polarization for each of flux guides 62 will be directed in a uniform, i.e., generally single, direction. Unfortunately, flux guides 62 are susceptible to corruption by exposure to externally applied magnetic fields (e.g., disturbing fields of approximately one hundred Gauss or more). This corruption, typically referred to as perming, can alter the magnetic state of flux guides 62 leading to unstable device characteristics including offset, axis alignment, and noise. Large offset shifts, axis rotations, and excess noise can be very difficult or even impossible to compensate/calibrate out of the sensor response and can render Z-axis magnetic field sensor 28 unusable.

Embodiments discussed herein employ a triad of sensor bridge designs for X-axis 54, Y-axis 56, and Z-axis 52 magnetic field sensing. The sensor bridge designs include multiple orientations of reference magnetization of the pinned layer and out-of-plane orientations of sense magnetization of the sense layer of a plurality of in-plane magnetoresistive sense elements. Additionally, external biasing of the sense layer of the in-plane magnetoresistive sense elements of the Z-axis sensor bridge utilizes a single permanent magnet layer with a single magnetization direction to enable Z-axis sensing without using flux guides.

Figure 3:
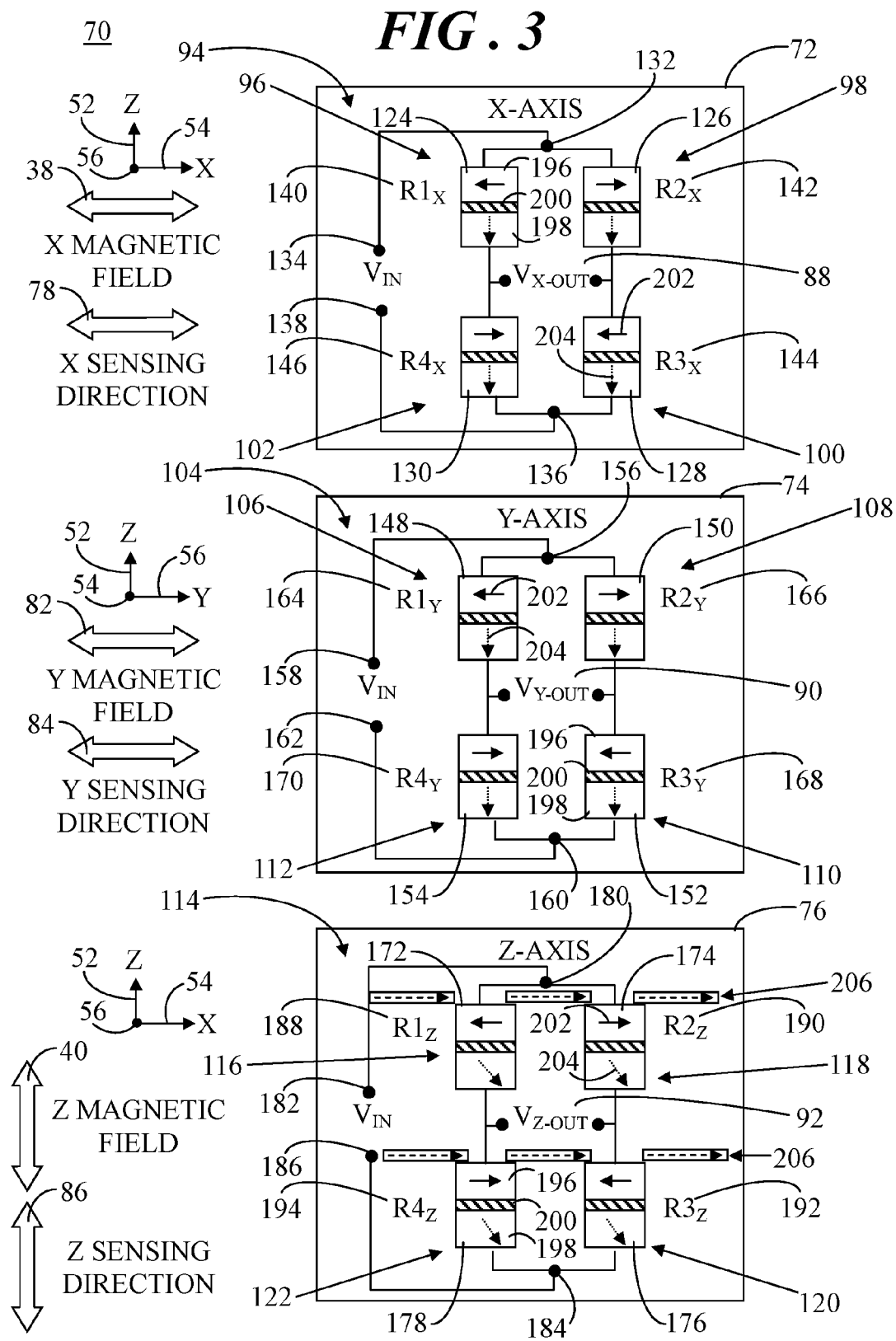
FIG. 3 shows a schematic view of a magnetic field sensor having multiple sense axes in accordance with an embodiment.

FIG. 3 shows a schematic view of a magnetic field sensor package 70 having multiple sense axes in accordance with an embodiment. More particularly, magnetic field sensor package 70 includes an X-axis magnetic field sensor 72, a Y-axis magnetic field sensor 74, and a Z-axis magnetic field sensor 76 each of which is capable of sensing an external magnetic field along mutually exclusive sense axes. Accordingly, X-axis magnetic field sensor 72 is sensitive to X-axis external magnetic field 38 in a sensing direction (referred to herein as X sensing direction 78) parallel to X-axis 54 and therefore parallel to an X-Y plane 80 (see FIG. 4) of magnetic field sensor package 70. Y-axis magnetic field sensor 74 is sensitive to a Y-axis external magnetic field 82 in a sensing direction (referred to herein as a Y sensing direction 84) parallel to Y-axis 56 and therefore also parallel to X-Y plane 80 (FIG. 4) of magnetic field sensor package 70. Conversely, Z-axis magnetic field sensor 76 is sensitive to Z-axis external magnetic field 40 in a sensing direction (referred to herein as a Z sensing direction 86) parallel to Z-axis 52 and therefore perpendicular to X-Y plane 80.

X-axis magnetic field sensor 72 produces an output signal 88, labeled $V_{X-OUT}$, indicative of the magnitude of X-axis external magnetic field 38. Y-axis magnetic field sensor 74 produces an output signal 90, labeled $V_{Y-OUT}$, indicative of the magnitude of Y-axis external magnetic field 82. And, Z-axis magnetic field sensor 76 produces an output signal 92, labeled $V_{Z-OUT}$, indicative of the magnitude of Z-axis external magnetic field 40.

Each of magnetic field sensors 72, 74, 76 includes a sensor bridge, and more particularly a Wheatstone bridge configuration. Thus, X-axis magnetic field sensor 72 is configured as a Wheatstone bridge, referred to herein as an X-axis Wheatstone bridge 94, that includes first, second, third, and fourth sensor legs 96, 98, 100, 102, respectively. Likewise, Y-axis magnetic field sensor 74 is configured as a Wheatstone bridge, referred to herein as a Y-axis Wheatstone bridge 104, that includes first, second, third, and fourth sensor legs 106, 108, 110, 112, respectively. And, Z-axis magnetic field sensor 76 is configured as a Wheatstone bridge, referred to herein as a Z-axis Wheatstone bridge 114, that includes first, second, third, and fourth sensor legs 116, 118, 120, 122, respectively.

Referring particularly to X-axis Wheatstone bridge 94 of X-axis magnetic field sensor 72, first sensor leg 96 includes one or more first magnetoresistive sense elements 124, second sensor leg 98 includes one or more second magnetoresistive sense elements 126, third sensor leg 100 includes one or more third magnetoresistive sense elements 128, and fourth sensor leg 102 includes one or more fourth magnetoresistive sense elements 130. Only one each of magnetoresistive sense elements 124, 126, 128, 130 is shown for simplicity of illustration. Those skilled in the art will readily recognize that X-axis magnetic field sensor 72 can include any number of magnetoresistive sense elements 124, 126, 128, 128.

First and fourth magnetoresistive sense elements 124, 130 are coupled in series to form a first half of X-axis Wheatstone bridge 94 and second and third magnetoresistive sense elements 126, 128 are coupled in series to form a second half of X-axis Wheatstone bridge 94. Thus, the first half of X-axis Wheatstone bridge 94 is coupled in parallel with the second half of X-axis Wheatstone bridge 94 such that a junction 132 of first and second magnetoresistive sense elements 124, 126 forms a first input terminal 134 and a junction 136 of third and fourth magnetoresistive sense elements 128, 130 forms a second input terminal 138.

For illustrative purposes, resistances are provided in association with magnetoresistive sense elements 124, 126, 128, 130. In this example, a resistance 140, $R1_X$, represents the signal output of first magnetoresistive sense element 124. A resistance 142, $R2_X$, represents the signal output of second magnetoresistive sense element 126. A resistance 144, $R3_X$, represents the signal output of third magnetoresistive sense element 128. And, a resistance 146, $R4_X$, represents the signal output of fourth magnetoresistive sense element 130.

Referring now to Y-axis Wheatstone bridge 104 of Y-axis magnetic field sensor 74, first sensor leg 106 includes one or more first magnetoresistive sense elements 148, second sensor leg 108 includes one or more second magnetoresistive sense elements 150, third sensor leg 110 includes one or more third magnetoresistive sense elements 152, and fourth sensor leg 112 includes one or more fourth magnetoresistive sense elements 154. First and fourth magnetoresistive sense elements 148, 154 are coupled in series to form a first half of Y-axis Wheatstone bridge 104 and second and third magnetoresistive sense elements 150, 152 are coupled in series to form a second half of Y-axis Wheatstone bridge 104. Thus, the first half of Y-axis Wheatstone bridge 104 is coupled in parallel with the second half of Y-axis Wheatstone bridge 104 such that a junction 156 of first and second magnetoresistive sense elements 148, 150 forms a first input terminal 158 and a junction 160 of third and fourth magnetoresistive sense elements 152, 154 forms a second input terminal 162.

Resistances are provided in association with magnetoresistive sense elements 148, 150, 152, 154. In this example, a resistance 164, $R1_Y$, represents the signal output of first magnetoresistive sense element 148. A resistance 166, $R2_Y$, represents the signal output of second magnetoresistive sense element 150. A resistance 168, $R3_Y$, represents the signal output of third magnetoresistive sense element 152. And, a resistance 170, $R4_Y$, represents the signal output of fourth magnetoresistive sense element 154.

Referring now to Z-axis Wheatstone bridge 114 of Z-axis magnetic field sensor 76, first sensor leg 116 includes one or more first magnetoresistive sense elements 172, second sensor leg 118 includes one or more second magnetoresistive sense elements 174, third sensor leg 120 includes one or more third magnetoresistive sense elements 176, and fourth sensor leg 122 includes one or more fourth magnetoresistive sense elements 178. First and fourth magnetoresistive sense elements 172, 178 are coupled in series to form a first half of Z-axis Wheatstone bridge 114 and second and third magnetoresistive sense elements 174, 176 are coupled in series to form a second half of Z-axis Wheatstone bridge 114. Thus, the first half of Z-axis Wheatstone bridge 114 is coupled in parallel with the second half of Z-axis Wheatstone bridge 114 such that a junction 180 of first and second magnetoresistive sense elements 172, 174 forms a first input terminal 182 and a junction 184 of third and fourth magnetoresistive sense elements 176, 178 forms a second input terminal 186.

Resistances are provided in association with magnetoresistive sense elements 172, 174, 176, 178. In this example, a resistance 188, $R1_Z$, represents the signal output of first magnetoresistive sense element 172. A resistance 190, $R2_Z$, represents the signal output of second magnetoresistive sense element 174. A resistance 192, $R3_Z$, represents the signal output of third magnetoresistive sense element 176. And, a resistance 194, $R4_Z$, represents the signal output of fourth magnetoresistive sense element 178.

Each of magnetoresistive sense elements 124, 126, 130, 132, 148, 150, 152, 154, 172, 174, 176, 178 is a magnetic tunnel junction (MTJ) sense element. Thus, each of sense elements 124, 126, 130, 132, 148, 150, 152, 154, 172, 174, 176, 178 includes a ferromagnetic pinned layer 196 and a ferromagnetic sense layer 198 separated by an insulator layer 200. As discussed above, electrodes may be in electrical communication with each of pinned and sense layers 196, 198 and the structure may be formed within a dielectric material. The electrodes and dielectric material are not shown herein for simplicity.

Figure 4:
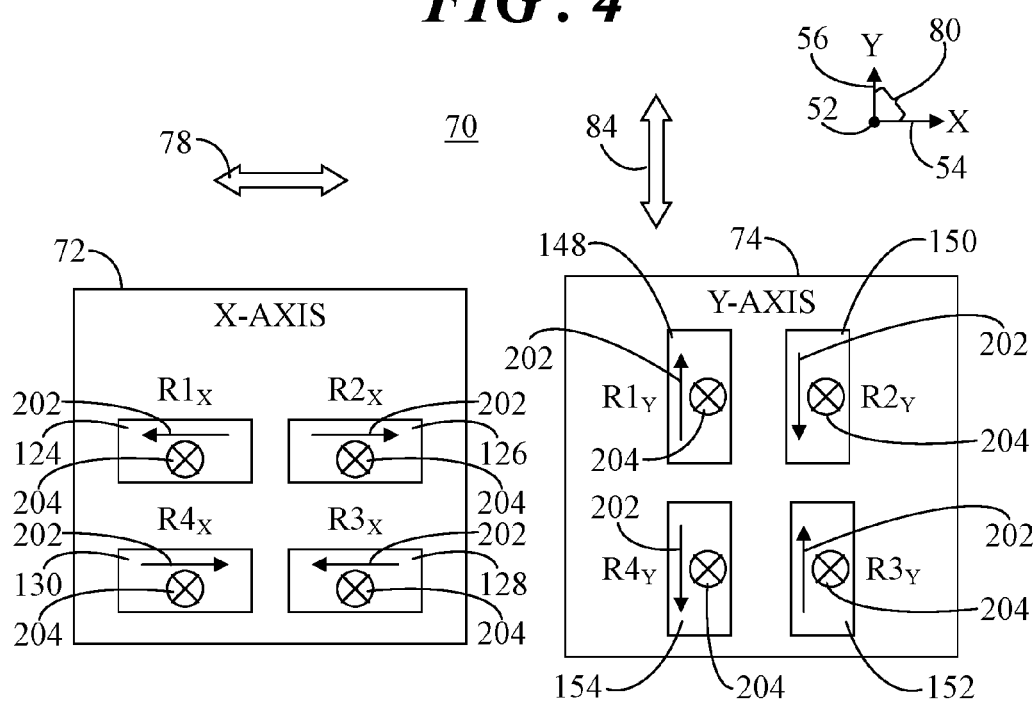
FIG. 4 shows a simplified top view of two magnetic field sensors within the sensor package of FIG. 3.

In accordance with an embodiment, pinned layer 196 has a reference magnetization, represented by a solid arrow 202, oriented substantially parallel to X-Y plane 80 (FIG. 4). Thus, as shown in FIG. 3, reference magnetization 202 of pinned layer 196 is represented by rightwardly and leftwardly directed arrows aligned with X-axis 54 for X-axis and Z-axis magnetic field sensors 72, 76. Similarly, reference magnetization 202 is represented by rightwardly and leftwardly directed arrows aligned with Y-axis 56 for Y-axis magnetic field sensor 74.

It should be observed that reference magnetization 202 of pinned layer 196 of each of first and third magnetoresistive sense elements 124, 128 of X-axis Wheatstone bridge 94 is oriented in a first direction (i.e., leftwardly) and reference magnetization 202 of pinned layer 196 of each of second and fourth magnetoresistive sense elements 126, 130 of X-axis Wheatstone bridge 94 is oriented in a second direction (i.e., rightwardly) that is antiparallel to the first direction.

The same configuration holds true for Y-axis and Z-axis Wheatstone bridges 104, 106. Thus, reference magnetization 202 of pinned layer 196 of each of first and third magnetoresistive sense elements 148, 152 of Y-axis Wheatstone bridge 104 is oriented in the leftward direction and reference magnetization 202 of pinned layer 196 of each of second and fourth magnetoresistive sense elements 150, 154 of Y-axis Wheatstone bridge 104 is oriented in the antiparallel rightward direction. Finally, reference magnetization 202 of pinned layer 196 of each of first and third magnetoresistive sense elements 172, 176 of Z-axis Wheatstone bridge 114 is oriented in the leftward direction and reference magnetization 202 of pinned layer 196 of each of second and fourth magnetoresistive sense elements 174, 178 of Z-axis Wheatstone bridge 114 is oriented in the antiparallel rightward direction. Exemplary methodology that can enable the multiple orientations of reference magnetization 202 of pinned layer 196 will be discussed below in connection with FIG. 4.

Sense layer 198 has a sense magnetization, represented by an arrow 204, that is magnetically biased to have an initial orientation, in the absence of any of external magnetic fields, in an out-of-plane direction relative to X-Y plane 80 (FIG. 4). Furthermore, sense magnetization of sense layer 198 is orientable from the out-of-plane direction toward or away from X-Y plane 80 in response to an external magnetic field. For each of X-axis and Y-axis magnetic field sensors 72, 74, the initial orientation of sense magnetization 204 is parallel to Z-axis 52, thus perpendicular to X-Y plane 80. As shown in FIG. 3, the initial orientation of sense magnetization 204 of sense layer 198 for each of X-axis and Y-axis magnetic field sensors 72, 74 is represented by downwardly directed arrows. However, for Z-axis field sensor 76, the initial orientation of sense magnetization 204, in the absence of external magnetic field 40 is not parallel to Z-axis 52, and is therefore non-perpendicular to X-Y plane 80. Accordingly, the initial orientation of sense magnetization 204 of sense layer 198 for Z-axis magnetic field sensor 76 is represented by diagonally directed (i.e., tilted) arrows.

In order to achieve the non-perpendicular initial orientation of sense magnetization 204 for magnetoresistive sense elements 172, 174, 176, 178, Z-axis magnetic field sensor 76 includes a permanent magnet layer 206 spaced apart from magnetoresistive sense elements 172, 174, 176, 178. More particularly, permanent magnet layer 206 is located out-of-plane from magnetoresistive sense elements 172, 174, 176, 178. In general, the inclusion of permanent magnet layer 206 enables detection of Z-axis magnetic field 40 in Z sensing direction 86 both of which are perpendicular to X-Y plane 80 (FIG. 4) of magnetic field sensor package 70. As such, no flux guides are required to guide Z-axis magnetic field 40 into X-Y plane 80. Permanent magnet layer 206 and variations thereof will be discussed in greater detail in connection with FIGS. 5 and 6.

FIG. 4 shows a simplified top view of two magnetic field sensors within magnetic field sensor package 70 (FIG. 3). More particularly, FIG. 4 shows a top view of X-axis magnetic field sensor 72 and Y-axis magnetic field sensor 74 in order to demonstrate the multiple orientations of pinned layer 196 (FIG. 3) of magnetoresistive sense elements 124, 126, 128, 130, 148, 150, 152, 154.

With regard to X-axis magnetic field sensor 72, reference magnetization 202 of first and third magnetoresistive sense elements 124, 128 is oriented leftward on the page in X-sensing direction 78 generally parallel to X-axis 54 and reference magnetization 202 of second and fourth magnetoresistive sense elements 126, 130 is oriented rightward on the page in X-sensing direction 78 generally parallel to X-axis 54. Thus, reference magnetization 202 of pinned layer 196 (FIG. 3) for each of second and fourth magnetoresistive sense elements 126, 130 is antiparallel to reference magnetization 202 of pinned layer 196 for each of first and third magnetoresistive sense elements 124, 128. However, the initial orientation of sense magnetization 204 for each of magnetoresistive sense elements 124, 126, 128, 130 is in a single out-of-plane direction directed into the page (represented by circles with inscribed X) resulting in a normal-to-plane magnetization vector for sense layer 198 (FIG. 3).

With regard to Y-axis magnetic field sensor 74, reference magnetization 202 of first and third magnetoresistive sense elements 148, 152 is oriented upward on the page in Y-sensing direction 84 generally parallel to Y-axis 56 and reference magnetization 202 of second and fourth magnetoresistive sense elements 150, 154 is oriented downward on the page in Y-sensing direction 84 generally parallel to Y-axis 56. Thus, reference magnetization 202 of pinned layer 196 (FIG. 3) for each of second and fourth magnetoresistive sense elements 150, 154 is antiparallel to reference magnetization 202 of pinned layer 196 for each of first and third magnetoresistive sense elements 148, 152. However, the initial orientation of sense magnetization 204 for each of magnetoresistive sense elements 148, 150, 152, 154 is in a single out-of-plane direction (directed into the page) resulting in a normal-to-plane magnetization vector for sense layer 198 (FIG. 3).

Although only top views of X-axis and Y-axis magnetic field sensors 72, 74 are shown in FIG. 4, it should be understood that reference magnetization 202 of magnetoresistive sense elements 172, 174, 176, 178 (FIG. 3) of Z-axis magnetic field sensor 76 is also oriented in X-Y-plane 80. For example, reference magnetization 202 of pinned layer 196 for first and third magnetoresistive sense elements 172, 176 may be oriented in X-sensing direction 78 generally parallel to X-axis 54 and reference magnetization 202 of pinned layer 196 for second and fourth magnetoresistive sense elements 174, 176 may also be oriented in X-sensing direction 78 generally parallel to X-axis 54, but in the opposite direction. Therefore, reference magnetization 202 of pinned layer 196 (FIG. 3) for each of second and fourth magnetoresistive sense elements 174, 178 is antiparallel to reference magnetization 202 of pinned layer 196 for each of first and third magnetoresistive sense elements 172, 176.

In some embodiments, magnetic field sensor 70 may be programmed by setting reference magnetization 202 of magnetoresistive sense elements 124, 126, 128, 148, 150, 152, 154, 172, 174, 176, 178 in the predetermined direction in X-Y plane 80 of pinned layer 196. A programming operation may be thermally assisted (e.g., a thermally assisted switching process) wherein the programming operation includes heating selected ones of the MTJ magnetoresistive sense elements 124, 126, 128, 148, 150, 152, 154, 172, 174, 176, 178 to a high temperature threshold. In such a situation, magnetoresistive sense elements 124, 126, 128, 148, 150, 152, 154, 172, 174, 176, 178 may include an antiferromagnetic layer (not shown) that pins reference magnetization 202 of pinned layer 196 at a low temperature threshold and frees reference magnetization 202 at the high temperature threshold. Heating the selected magnetoresistive sense elements 124, 126, 128, 148, 150, 152, 154, 172, 174, 176, 178 at the high temperature threshold may be performed by passing a heating current in the selected magnetoresistive sense elements 124, 126, 128, 148, 150, 152, 154, 172, 174, 176, 178 via a current line (not shown). Other techniques may be implemented to provide localized heating such as, from a separate adjacent current line, by using a laser or other radiative source, and so forth. After switching reference magnetization 202 to the desired fixed magnetization orientation, the selected magnetoresistive sense elements 124, 126, 128, 148, 150, 152, 154, 172, 174, 176, 178 can be cooled to the low temperature threshold to pin, or fix, reference magnetization 202 in the switched state. Other embodiments may employ existing or upcoming techniques for pinning reference magnetization 202 to a desired magnetization orientation so as to achieve the multiple fixed orientations of reference magnetization 202 of pinned layer 196 of magnetoresistive sense elements 124, 126, 128, 148, 150, 152, 154, 172, 174, 176, 178.

As mentioned previously, the initial orientation of sense magnetization 204 of sense layer 198 (FIG. 3) for each of magnetoresistive sense elements 124, 126, 128, 130, 148, 150, 152, 154 (in the absence of an external magnetic field) is in a single out-of-plane direction resulting in a normal-to-plane magnetization vector for sense layer 198 (FIG. 3). In some embodiments, sense layer 198 may include a sense ferromagnetic layer and a non-magnetic layer. The specific structure of sense layer 198 is not illustrated herein for simplicity. The sense ferromagnetic layer of sense layer 198 may include any one of Co, Fe, Ni, or an alloy comprising any one or a combination of these elements. The non-magnetic layer may include any one of Pt, Pd, Ta, Hf, Nb, Cr, V, Cu, Au, Ti, Ag, Ru, W, or an alloy comprising any one or a combination of these elements. Through the material properties of the sense ferromagnetic layer and non-magnetic layer of sense layer 198, sense magnetization 204 of sense layer 198 of each of magnetoresistive sense elements 124, 126, 128, 148, 150, 152, 154, 172, 174, 176, 178 may be suitably self-biased in the single out-of-plane direction. Other embodiments may employ shape anisotropy, or other existing and upcoming techniques for initially orienting (i.e., self-biasing) sense magnetization 204 (in the absence of an external magnetic field) perpendicular to X-Y plane 80.

The Wheatstone bridge configurations (e.g., Wheatstone bridges 94, 104, 114 for respective magnetic field sensors 72, 74, 76), where $R1_i=R2_i=R3_i=R4_i$, with signal driven changes in $R1_i$ and $R3_i$ being opposed to the signal driven changes in $R2_i$ and $R4_i$ can enable a null (or near null) operating point which centers the output of the Wheatstone sensor bridge within the input range of the subsequent amplification circuitry. Additionally, the configuration of Wheatstone bridges 94, 104, 114 enables good rejection (i.e., cancellation) of common mode effects in each sensor which helps to compensate for thermal effects or stress effects, etc. Furthermore, the differential configuration of Wheatstone bridges 94, 104, 114 provides the highest sensitivity. In accordance with an embodiment in which sense magnetization 204 of sense layer 198 is biased in a vertical direction parallel to Z-axis 52, the antiparallel (in-plane) orientations of reference magnetization 202 of pinned layer 196 provide the optimal biasing point on the response curve of the MTJ—exactly in the center of the symmetric curve (at ninety degrees to each pinned vector) where the slope (sensitivity) is the greatest and signal linearity is the best.

With regard to Z-axis magnetic field sensor 76, the initial orientation of sense magnetization 204 of sense layer 198 (FIG. 3) for each of magnetoresistive sense elements 172, 174, 176, 178 (in the absence of an external magnetic field) is in a single out-of-plane direction that is non-perpendicular to X-Y plane 80. In order to achieve this desired initial orientation of sense magnetization 204 for each of magnetoresistive sense elements 172, 174, 176, 178, it may be possible to first implement any of the above discussed techniques for setting the initial orientation of sense magnetization 204 perpendicular to X-Y plane 80 during fabrication. Thereafter, permanent magnet layer 206 can be suitably formed to shift, i.e., rotate, sense magnetization 204 from the perpendicular orientation to the non-perpendicular out-of-plane orientation.

Figure 5:
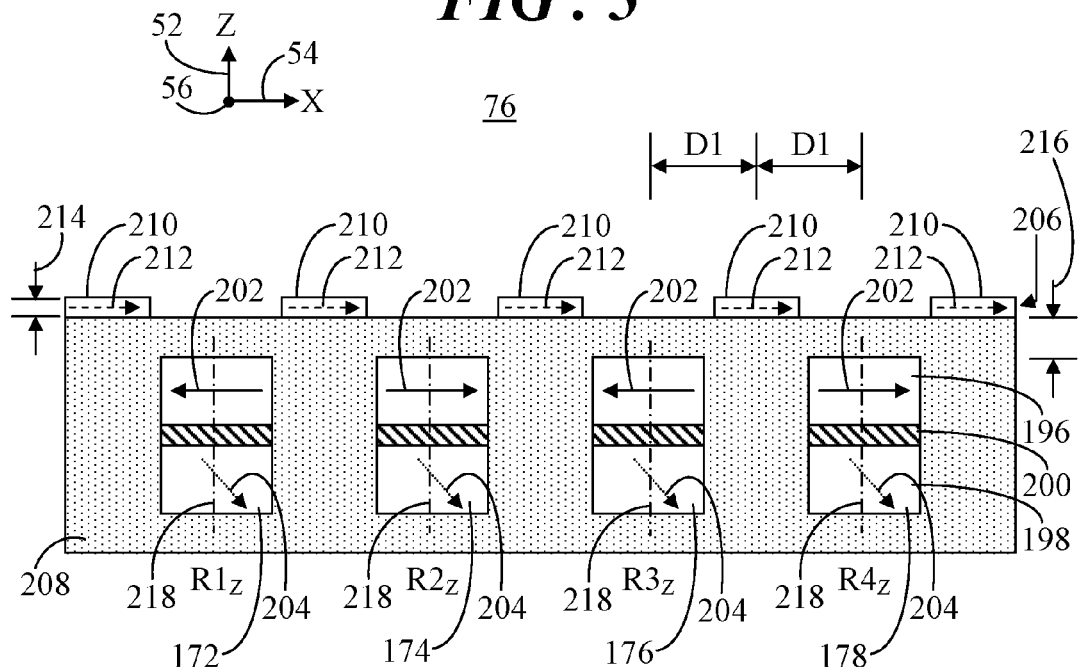
FIG. 5 shows a side view of one of the magnetic field sensors within the sensor package of FIG. 3.

Referring now to FIG. 5, FIG. 5 shows a side view of Z-axis magnetic field sensor 76 within magnetic field sensor package 70 (FIG. 3). FIG. 5 is provided to illustrate that each of magnetoresistive sense elements 172, 174, 176, 178 can be fabricated utilizing current techniques so that sense elements 172, 174, 176, 178 are formed in a common plane (i.e., they are arranged in-plane) relative to one another within a dielectric material 208 with suitable electrically conductive interconnections (not shown) to form Z-axis Wheatstone bridge 114 (FIG. 3).

FIG. 5 further demonstrates an exemplary arrangement of segments 210 of permanent magnet layer 206. As shown, permanent magnet layer 206 is located out-of-plane from magnetoresistive sense elements 172, 174, 176, 178. In this exemplary illustration, permanent magnet layer 206 is located above magnetoresistive sense elements 172, 174, 176, 178. In other embodiments, permanent magnet layer 206 may be located out-of-plane below magnetoresistive sense elements 172, 174, 176, 178. In still other embodiments, segments 210 of permanent magnet layer 206 may be formed in a common plane relative to one another that is also co-planar with magnetoresistive sense elements 172, 174, 176, 178. Further, although a single permanent magnet layer 206 is shown, alternative embodiments may include two or more permanent magnet layers.

In order to enable the suitable out-of-plane biasing of sense magnetization 204 of sense layer 198 and to concurrently enable efficiency in fabrication, permanent magnet layer 206 has a single magnetic orientation, a single thickness, and a single spacing away from magnetoresistive sense elements 172, 174, 176, 178. In this example, a magnetic orientation 212 of each of magnet segments 210 is substantially parallel to X-Y plane 80 (FIG. 4) of magnetic field sensor package 70 (FIG. 3). More specifically, magnetic orientation 212 is parallel to X-axis 54 and directed rightward on the page. Additionally, permanent magnet layer 206 is suitably deposited, patterned, and etched such that magnet segments 210 are each characterized by a single thickness 214. Thus, the entire area of permanent magnet layer 206 is of the same thickness 214. Furthermore, permanent magnet layer 206 is formed on dielectric material 208 so that permanent magnet layer 206 is characterized by a single out-of-plane spacing 216 away from magnetoresistive sense elements 172, 174, 176, 178.

Each of magnetoresistive sense elements 172, 174, 176, 178 can be characterized by a central axis 218 oriented parallel to Z-axis 52 and therefore perpendicular to X-Y plane 80 (FIG. 4). In the example shown, magnet segments 210 may be laterally displaced away from central axis 218 of each of magnetoresistive sense elements 172, 174, 176, 178. More critically, magnet segments 210 are displaced an equivalent distance (labeled D1 in FIG. 5) away from central axis 218 of adjacent (or nearby) magnetoresistive sense elements 172, 174, 176, 178 in a symmetrical configuration. Accordingly, permanent magnet layer 206 can be strategically patterned (shape, location, and position) to generate one unique, in-plane external bias field vector of sense layer 198 to enable Z-axis Wheatstone bridge 114 to respond to Z-axis external magnetic field 40 in Z sensing direction 86.

Figure 6:
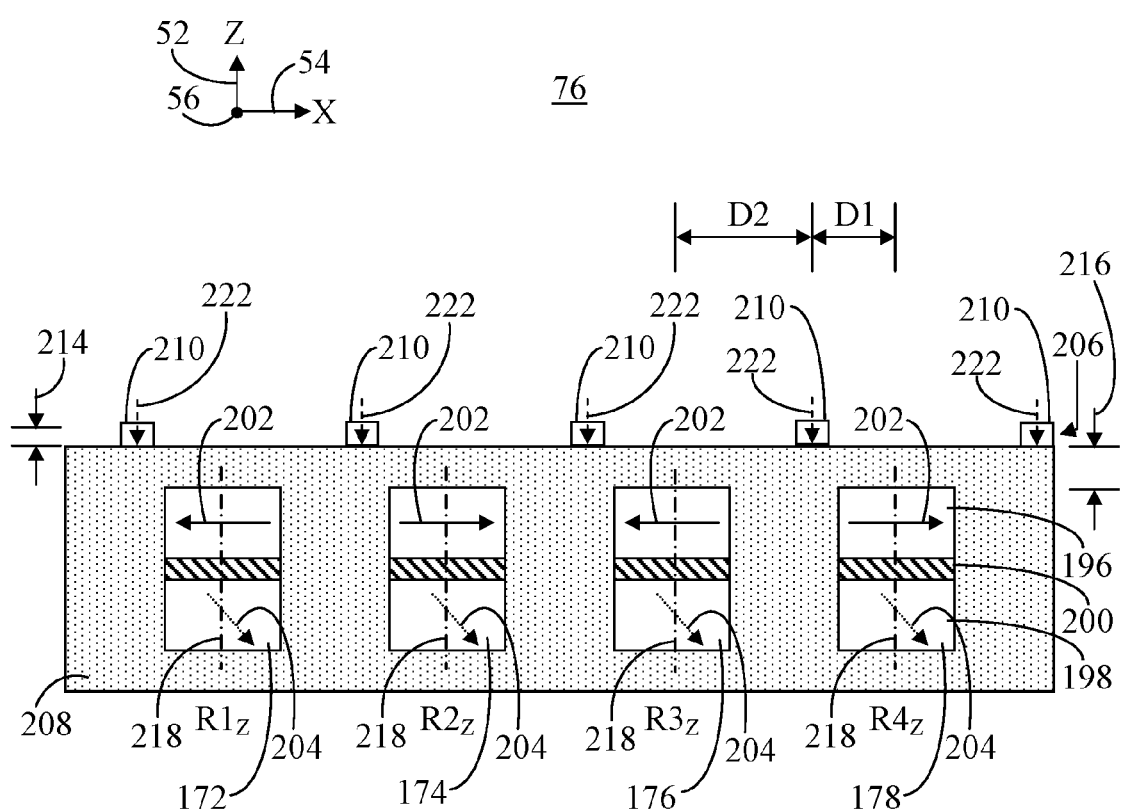
FIG. 6 shows a side view of one of the magnetic field sensors within the sensor package of FIG. 3 in accordance with an alternative embodiment.

FIG. 6 shows a side view of Z-axis magnetic field sensor 76 within magnetic field sensor package 70 (FIG. 3) in accordance with an alternative embodiment. Again, magnet segments 210 of permanent magnet layer 206 are located out-of-plane from magnetoresistive sense elements 172, 174, 176, 178. In this exemplary illustration, a magnetic orientation 222 of each of magnet segments 210 is substantially perpendicular to X-Y plane 80 (FIG. 4) of magnetic field sensor 70. More specifically, magnetic orientation 222 is parallel to Z-axis 52 and directed downward on the page.

In the example shown, magnet segments 210 may be laterally displaced away from central axis 218 of each of magnetoresistive sense elements 172, 174, 176, 178. However, each magnet segment 210 is located closer to (labeled D1 in FIG. 6) central axis 218 of its corresponding one of magnetoresistive sense elements 172, 174, 176, 178 than to central axis 218 of the remaining magnetoresistive sense elements 172, 174, 176, 178 (labeled D2 in FIG. 6) in an asymmetrical configuration. Each magnet segment 210 is spaced closer to its corresponding one of magnetoresistive sense elements 172, 174, 176, 178 so that magnet segment 210 largely affects sense magnetization 204 of sense layer 198 (FIG. 3) of that particular magnetoresistive sense element 172, 174, 176, 178. Conversely, each magnet segment 210 is spaced sufficiently far away from the remaining magnetoresistive sense elements 172, 174, 176, 178 so that magnet segment 210 does not significantly affect sense magnetization 204 of sense layer 198 (FIG. 3) the remaining magnetoresistive sense elements 172, 174, 176, 178. Accordingly, like the configuration of FIG. 5, permanent magnet layer 206 of FIG. 6 can be strategically patterned (shape, location, and position) to generate one unique, in-plane external bias field vector of sense layer 198 to enable Z-axis Wheatstone bridge 114 to respond to Z-axis external magnetic field 40 in Z sensing direction 86.

Figure 7:
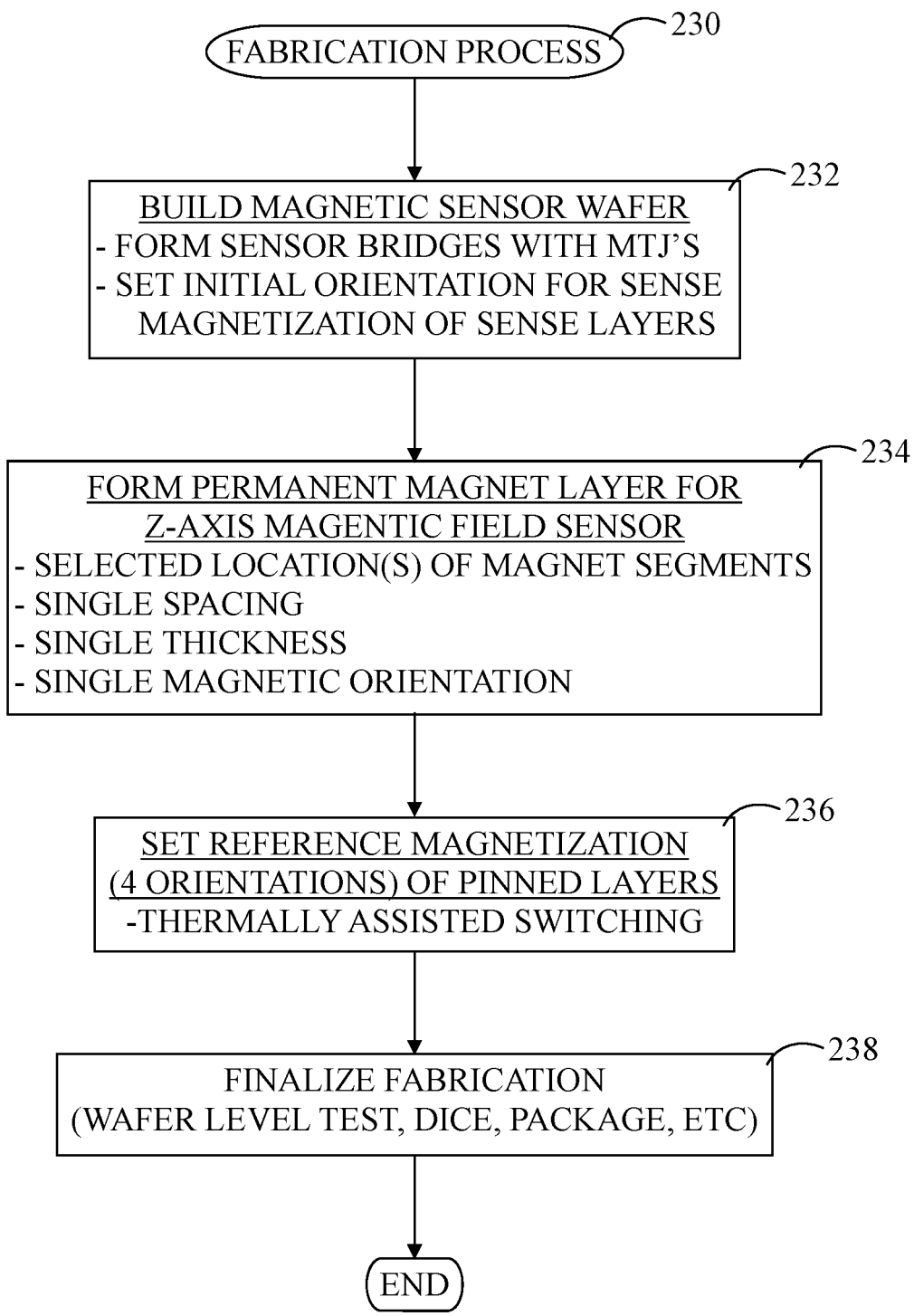
FIG. 7 shows a flowchart of a fabrication process for manufacturing the magnetic field sensor of FIG. 3.

FIG. 7 shows a flowchart of a fabrication process 230 in accordance with another embodiment. Fabrication process 230 is described in connection with the fabrication of magnetic field sensor package 70 (FIG. 3) having three sense axes (e.g., X-axis, Y-axis, Z-axis magnetic field sensors 72, 74, 76). Thus, FIG. 3 should be viewed in concurrence with the fabrication methodology of FIG. 7. However, fabrication process 230 may be readily adapted to produce a single or dual sense axis magnetic field sensor.

Those skilled in the art will recognize that fabrication process 230 is exemplary in nature. Thus, only the primary operations of fabrication process 230 are discussed herein for simplicity. Furthermore, the process blocks depicted in FIG. 7 may be performed in parallel with each other or with performing other processes, and each process block will include many separate process steps. In addition, it is to be understood that the particular ordering of the process blocks depicted in FIG. 7 may be modified while achieving substantially the same result. Accordingly, such modifications are intended to be included within the scope of the inventive subject matter.

At a process block 232, a magnetic sensor wafer is built, i.e., fabricated, utilizing known methodologies to produce a plurality of sensor bridges (e.g., Wheatstone bridges 94, 104, 114). Each of the sensors bridges are thus fabricated to include four sensor legs, with each sensor leg having one or more magnetoresistive sense elements, e.g., MTJ's. Fabrication of the magnetic sense wafer concurrently entails setting (i.e., self-biasing) the initial orientation of sense magnetization 204 of sense layer 198 of each of the magnetoresistive sense elements by building sense layer 198 to include ferromagnetic and non-magnetic layers, by "growing in" or otherwise treating sense layer 198, and/or by shape anisotropy so that sense magnetization 204 of sense layer 198, in the absence of an external magnetic field, will be in an out-of-plane direction relative to X-Y plane 80 (FIG. 4) of magnetic field sensor package 70.

At a process block 234, permanent magnet layer 206 is suitably formed for Z-axis magnetic field sensor 76 in order to magnetically bias sense magnetization 204, in the absence of Z-axis external magnetic field 40, in the out-of-plane direction that is also non-perpendicular to X-Y plane 80 (FIG. 4). Considerations for biasing sense magnetization 204 include selecting locations at which magnet segments 210 (FIG. 5) will be positioned, a single out-of-plane spacing 216 (FIG. 5) of magnet segments 210 from magnetoresistive elements 172, 174, 176, 178, a single thickness 214 (FIG. 5) of permanent magnet layer 206, and a single magnetic orientation (i.e., the planar orientation 212 of FIG. 5 or the out-of-plane orientation 222 of FIG. 6) of magnet segments 210. Formation of permanent magnet layer 206 may entail deposition, patterning, and etching of a suitable material to form magnet segments 210. Such material may include iron, nickel, cobalt, some alloys of rare earth materials or an alloy comprising any one or a combination of these elements, that is magnetized and creates its own persistent magnetic field. Preferably, permanent magnet layer 206 is formed from a magnetically "hard" material that is subjected to processing in a powerful magnetic field during manufacture to align its internal microcrystalline structure, so as to make it very difficult to demagnetize.

At a process block 236, reference magnetization 202 of pinned layers 196 of each of the magnetoresistive sense elements is set. By way of example, a thermally assisted switching (TAS) process may be performed to set reference magnetization 202, as discussed above. In accordance with an embodiment, four orientations of reference magnetization 202 may be set. Two orientations of reference magnetization 202 are aligned with X-axis 54, but are antiparallel relative to one another (e.g., X-axis and Z-axis magnetic field sensors 72, 76). Additionally, two orientations of reference magnetization 202 are aligned with Y-axis 56, but are antiparallel relative to one another (e.g., Y-axis magnetic field sensor 74).

At a process block 238, fabrication of the magnetic sensor wafer continues with fabrication finalization processes such as wafer level testing, dicing, packaging, and the like. Thereafter, fabrication process 230 ends.

Thus, embodiments disclosed herein entail a magnetic field sensor capable of sensing magnetic fields along one or more mutually exclusive sense axes, typically referred to as the X-axis, Y-axis, and Z-axis. An embodiment of a magnetic field sensor comprises a sensor bridge, the sensor bridge including multiple sensor legs, and the sensor legs including magnetoresistive sense elements located in a plane of the magnetic field sensor and sensitive to an external magnetic field along a sensing direction. Each of the magnetoresistive sense elements comprises a pinned layer having a reference magnetization oriented substantially parallel to the plane and a sense layer having a sense magnetization that is magnetically biased to have an initial orientation, in the absence of the external magnetic field, in an out-of-plane direction relative to the plane. The sense magnetization of the sense layer is orientable from the out-of-plane direction toward the plane of the magnetic field sensor in response to the external magnetic field.

Another embodiment of a magnetic field sensor comprises a sensor bridge, the sensor bridge including multiple sensor legs, and the sensor legs including magnetoresistive sense elements located in a plane of the magnetic field sensor and sensitive to an external magnetic field along a sensing direction, and the external magnetic field being perpendicular to the plane of the magnetic field sensor. Each of the magnetoresistive sense elements comprises a pinned layer having a reference magnetization oriented substantially parallel to the plane and a sense layer having a sense magnetization that is magnetically biased to have an initial orientation, in the absence of the external magnetic field, in an out-of-plane direction relative to the plane. The magnetic field sensor further comprises a permanent magnet layer located out-of-plane from the magnetoresistive sense elements and characterized by a single magnetic orientation. The permanent magnet layer magnetically biases the initial orientation of the sense magnetization, in the absence of the external magnetic field, in the out-of-plane direction that is non-perpendicular to the plane of the magnetic field sensor. The sense magnetization of the sense layer is orientable from the out-of-plane direction toward the plane of the magnetic field sensor in response to the external magnetic field, and the permanent magnet layer enables detection of the external magnetic field in the sensing direction that is also perpendicular to the plane of the magnetic field sensor.

Accordingly, a sensor bridge configuration of magnetoresistive sense elements can be implemented for each sense axis. Each sensor bridge incorporates multiple orientations of reference magnetization of the pinned layer, along with out-of-plane biasing of the sense layer for each of the magnetoresistive sense elements. Additionally, one sensor bridge design is utilized for sensing an external magnetic field that is perpendicular to the plane of the magnetic field sensor package and includes a single permanent magnetic layer with a single magnetization direction to enable sensing of the out-of-plane external magnetic field without the use of flux concentrators. The various inventive concepts and principles embodied herein enable an ultra low power, multiple sense axis magnetic field sensor without detrimental perming effects for improved sensitivity, reliability, and cost savings.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A magnetic field sensor comprising:
    a sensor bridge, said sensor bridge including multiple sensor legs, said sensor legs including magnetoresistive sense elements located in a plane of said magnetic field sensor and sensitive to an external magnetic field along a sensing direction, wherein each of said magnetoresistive sense elements comprises:
        a pinned layer having a reference magnetization oriented substantially parallel to said plane; and
        a sense layer having a sense magnetization that is magnetically biased to have an initial orientation, in the absence of said external magnetic field, in an out-of-plane direction relative to said plane, wherein said sense magnetization of said sense layer is orientable from said out-of-plane direction toward said plane of said magnetic field sensor in response to said external magnetic field; and
    a permanent magnet layer spaced apart from said magnetoresistive sense elements, said permanent magnet layer magnetically biasing said initial orientation of said sense magnetization, in the absence of said external magnetic field, in said out-of-plane direction that is non-perpendicular to said plane of said magnetic field sensor, wherein said external magnetic field is perpendicular to said plane of said magnetic field sensor, and inclusion of said permanent magnet layer enables detection of said external magnetic field in said sensing direction that is also perpendicular to said plane of said magnetic field sensor.

2. The magnetic field sensor of claim 1 wherein said multiple sensor legs comprise:
    a first sensor leg having a first one of said magnetoresistive sense elements;
    a second sensor leg having a second one of said magnetoresistive sense elements;
    a third sensor leg having a third one of said magnetoresistive sense elements; and
    a fourth sensor leg having a fourth one of said magnetoresistive sense elements, wherein:
        said first, second, third, and fourth sensor legs are coupled as a Wheatstone bridge such that said first and fourth magnetoresistive sense elements are coupled in series to form a first half of said Wheatstone bridge, said second and third magnetoresistive sense elements are coupled in series to form a second half of said Wheatstone bridge, said first half of said Wheatstone bridge is coupled in parallel with said second half of said Wheatstone bridge such that a first junction of said first and second magnetoresistive sense elements forms a first input terminal and a second junction of said third and fourth magnetoresistive sense elements forms a second input terminal;
        said reference magnetization of said pinned layer of each of said first and third magnetoresistive sense elements is oriented in a first direction; and
        said reference magnetization of said pinned layer of each of said second and fourth magnetoresistive sense elements is oriented in a second direction, said second direction being antiparallel to said first direction.

3. The magnetic field sensor of claim 2 wherein:
    said pinned layer of each of said first and third magnetoresistive sense elements is oriented in said first direction using a thermally assisted switching process; and
    said pinned layer of each of said second and fourth magnetoresistive sense elements is oriented in said second direction using said thermally assisted switching process.

4. The magnetic field sensor of claim 2 wherein said Wheatstone bridge is a first Wheatstone bridge, and said magnetic field sensor further comprises a second Wheatstone bridge, said second Wheatstone bridge including:
    a fifth sensor leg having a fifth magnetoresistive sense element;
    a sixth sensor leg having a sixth magnetoresistive sense element;
    a seventh sensor leg having a seventh magnetoresistive sense element; and
    an eighth sensor leg having an eighth magnetoresistive sense element, wherein:
        said fifth and eighth magnetoresistive sense elements are coupled in series to form a first half of said second Wheatstone bridge, said sixth and seventh magnetoresistive sense elements are coupled in series to form a second half of said second Wheatstone bridge, said first half of said second Wheatstone bridge is coupled in parallel with said second half of said second Wheatstone bridge such that a third junction of said fifth and sixth magnetoresistive sense elements forms a third input terminal and a fourth junction of said seventh and eighth magnetoresistive sense elements forms a fourth input terminal.

5. The magnetic field sensor of claim 4 wherein said external magnetic field is a first external magnetic field, said sensing direction is a first sensing direction, and each of said fifth, sixth, seventh, and eighth magnetoresistive sense elements comprises:
said pinned layer having said reference magnetization oriented substantially parallel to said plane; and
said sense layer having said sense magnetization that is magnetically biased to have said initial orientation, in the absence of said external magnetic field, in a second out-of-plane direction that is perpendicular to said plane of said magnetic field sensor, said sense magnetization of said sense layer being orientable from said second out-of-plane direction toward said plane of said magnetic field sensor in response to a second external magnetic field along a second sensing direction that is orthogonal to said first sensing direction, wherein:
said reference magnetization of said pinned layer of each of said fifth and seventh magnetoresistive sense elements is oriented in a third direction that is orthogonal to said first direction; and
said reference magnetization of said pinned layer of each of said sixth and eighth magnetoresistive sense elements is oriented in a fourth direction, said fourth direction being antiparallel to said third direction.

6. The magnetic field sensor of claim 1 wherein said permanent magnet layer is characterized by a single magnetic orientation.

7. The magnetic field sensor of claim 6 wherein said single magnetic orientation is substantially parallel to said magnetic field sensor.

8. The magnetic field sensor of claim 7 wherein each of said magnetoresistive sense elements is characterized by a central axis, and said permanent magnet layer comprises a plurality of magnet segments, each of said magnet segments being laterally displaced away from said central axis of adjacent ones of said each of said magnetoresistive sense elements by an equivalent distance in a symmetric configuration.

9. The magnetic field sensor of claim 6 wherein said single magnetic orientation is substantially perpendicular to said magnetic field sensor.

10. The magnetic field sensor of claim 1 wherein said permanent magnet layer is characterized by a single thickness across an entire area of said permanent magnet layer.

11. The magnetic field sensor of claim 1 wherein said permanent magnet layer is located out-of-plane from said magnetoresistive sense elements, and said permanent magnet layer is characterized by a single out-of-plane spacing away from each of said magnetoresistive sense elements.

12. A magnetic field sensor comprising:
a sensor bridge, said sensor bridge including multiple sensor legs, said sensor legs including magnetoresistive sense elements located in a plane of said magnetic field sensor and sensitive to an external magnetic field along a sensing direction, wherein each of said magnetoresistive sense elements comprises:
a pinned layer having a reference magnetization oriented substantially parallel to said plane; and
a sense layer having a sense magnetization that is magnetically biased to have an initial orientation, in the absence of said external magnetic field, in an out-of-plane direction relative to said plane, wherein said sense magnetization of said sense layer is orientable from said out-of-plane direction toward said plane of said magnetic field sensor in response to said external magnetic field; and
a permanent magnet layer spaced apart from said magnetoresistive sense elements, said permanent magnet layer magnetically biasing said initial orientation of said sense magnetization, in the absence of said external magnetic field, in said out-of-plane direction that is non-perpendicular to said plane of said magnetic field sensor, said permanent magnet layer being characterized by a single magnetic orientation that is substantially perpendicular to said magnetic field sensor, wherein:
each of said magnetoresistive sense elements is characterized by a central axis;
said permanent magnet layer comprises a plurality of magnet segments; and
for said each of said magnetoresistive sense elements, one of said magnet segments is positioned closer to said central axis than to said central axis of remaining ones of said magnetoresistive sense elements in an asymmetric configuration.

* * * * *